United States Patent
Chen et al.

(10) Patent No.: US 7,446,295 B2
(45) Date of Patent: Nov. 4, 2008

(54) IMAGE SENSOR MODULE HAVING AN IMAGE SIGNAL PROCESSOR BEING PHYSICALLY AND ELECTRICALLY UNCONNECTED TO A SUPPORTING BOARD OF AN IMAGE SENSOR CHIP

(75) Inventors: Jian-Cheng Chen, Tainan Hsien (TW); Ming-Hsiang Cheng, Kaohsiung (TW); Chia-Jung Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/532,911

(22) Filed: Sep. 19, 2006

(65) Prior Publication Data

US 2008/0048097 A1 Feb. 28, 2008

(30) Foreign Application Priority Data

Aug. 28, 2006  (TW) .................................. 95131531

(51) Int. Cl.
 *H01L 27/00* (2006.01)
(52) U.S. Cl. .................................. 250/208.1; 250/239

(58) Field of Classification Search .............. 250/208.1, 250/214 R, 214.1, 239; 257/431–434, 678, 257/680, 778, 440; 396/73, 75, 77, 529, 396/535; 348/335, 345, 373, 374, 376, 375, 348/294, 65, 66; 358/483, 484, 472, 474
See application file for complete search history.

(56) References Cited

U.S. PATENT DOCUMENTS

| | | | | |
|---|---|---|---|---|
| 5,808,878 | A  * | 9/1998 | Saito et al. ................... | 361/818 |
| 6,320,257 | B1 * | 11/2001 | Jayaraj et al. ................ | 257/723 |
| 6,507,107 | B2 * | 1/2003 | Vaiyapuri .................... | 257/723 |
| 6,680,525 | B1 * | 1/2004 | Hsieh et al. .................. | 257/680 |
| 2007/0075408 | A1* | 4/2007 | Shibayama et al. ......... | 257/678 |
| 2007/0132078 | A1* | 6/2007 | Matsumoto ................. | 257/678 |

* cited by examiner

*Primary Examiner*—Que T Le
(74) *Attorney, Agent, or Firm*—Jianq Chyun IP Office

(57) ABSTRACT

An image sensor module including a substrate, an image signal processor, a supporting board, an image sensor chip and a cover is provided. A concavity is located on a surface of the substrate. The image signal processor is disposed in the concavity e, and is electrically connected to the substrate. The supporting board is disposed on the surface of the substrate and covers the concavity. The image sensor chip is disposed on the supporting board and electrically connected to the substrate. The cover is disposed on the substrate, and covers the image sensor chip.

11 Claims, 2 Drawing Sheets

US 7,446,295 B2

IMAGE SENSOR MODULE HAVING AN IMAGE SIGNAL PROCESSOR BEING PHYSICALLY AND ELECTRICALLY UNCONNECTED TO A SUPPORTING BOARD OF AN IMAGE SENSOR CHIP

CROSS-REFERENCE TO RELATED APPLICATION

This application claims the priority benefit of Taiwan application serial no. 95131531, filed Aug. 28, 2006. All disclosure of the Taiwan application is incorporated herein by reference.

BACKGROUND OF THE INVENTION

1. Field of the Invention

The present invention relates to a sensor module, and more particularly, to an image sensor module.

2. Description of Related Art

The process for manufacturing CMOS image sensor (CIS) is compatible with that for manufacturing CMOS transistor. As this image sensor can be easily integrated with other peripheral circuits onto the same chip, the cost and power consumption of the image sensor are greatly reduced. In recent years, the CMOS image sensor has replaced the charge-coupled device (CCD) in the lower level application and has become popular day by day.

FIG. 1 is a schematic view of a conventional image sensor module. The conventional image sensor module 100 comprises a substrate 110, an image signal processor (ISP) 120, an image sensor chip (CIS) 130 and an actuator 140. The substrate 110 has a bottom surface 110a and a corresponding top surface 110b. The image signal processor 120 is disposed on the bottom surface 110a of the substrate 110 and electrically connected to the substrate 110. The image sensor chip 130 is disposed on the top surface 110b of the substrate 110 to capture image data, wherein the image sensor chip 130 is electrically connected to the substrate 110 via wire bonding. The actuator 140 is disposed on the top surface 110b of the substrate 110, and covers the CIS 130. The actuator 140 comprises a plurality of optical lenses 142 and accomplishes the operation of image self-focusing through the control of the image signal processor 120. A filter 144 is disposed below the optical lens 142 for filtering out unnecessary lights. The above image sensor module 100 is electrically connected to a flexible circuit substrate 10 and delivers image signals captured by the image sensor module 100 to a chip 12 on the flexible circuit substrate 10, so as to process the image signals.

However, the conventional image signal processor 120 is disposed on the bottom surface 110a of the substrate 110 in the form of a module, such that the whole image sensor module 100 has a larger thickness, which thus cannot satisfy the current requirements for the electronic products of being light, slim, short, small and portable.

Referring to FIG. 2, which shows a schematic view of another conventional image sensor module. In the image sensor module 200 shown in FIG. 2, an image signal processor 220 is disposed on a substrate 210, and is electrically connected to the substrate 210 by wires 260. An image sensor chip 230 is stacked on the image signal processor 220 via a spacer 250, and is electrically connected to the substrate 210 by wires 270. Being similar to the above image sensor module 100 shown in FIG. 1, the image sensor module 200 is electrically connected to a flexible circuit substrate 20, and delivers image signals captured by the image sensor module 200 to a chip 22 on the flexible circuit substrate 20, so as to process the image signals.

However, in the image sensor module 200, overheat of the image sensor chip 230 and the image signal processor 220 may easily occurs and lead to low working efficiency or short life time due to the stacked disposition between the image sensor chip 230 and the image signal processor 220. In addition, the internal height of the actuator 140 is generally considered only for accommodating the image sensor chip 230, and the height is restricted to some extent. When the actuator 140 is assembled on the substrate 210, the actuator 140 may easily squeeze and damage the wire 270 connected between the image signal processor 220 and the substrate 210, which may lead to the failure of electrical signal transmission between the image signal processor 220 and the substrate 210.

SUMMARY OF THE INVENTION

The present invention provides an image sensor module with a slimmer size.

The present invention can solve the internal heat dissipation problem for the image sensor module.

Furthermore, the present invention provides an image sensor module, wherein the electrical connection between an image signal processor and a substrate of the image sensor module is well maintained.

Accordingly, the present invention provides an image sensor module, which comprises a substrate, an image signal processor, a supporting board, an image sensor chip and a cover. A concave is formed on a surface of the substrate. The image signal processor is disposed in the concave, and is electrically connected to the substrate. The supporting board is disposed on the surface of the substrate and covers the concave. The image sensor chip is disposed on the supporting board and is electrically connected to the substrate. The cover is disposed on the substrate and covers the image sensor chip.

In the present invention, the image signal processor is disposed in the concave of the substrate, to reduce the height of the image sensor module. In addition, the image sensor chip can be disposed on a heat sink so as to reduce the internal temperature of the chip. Further, the concave of the substrate may have at least one vent hole at the bottom, so that the heat within the image sensor module can be dissipated to the ambient environment via the vent holes due to the convection effect. Therefore, the internal temperature of the image sensor module can be reduced.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
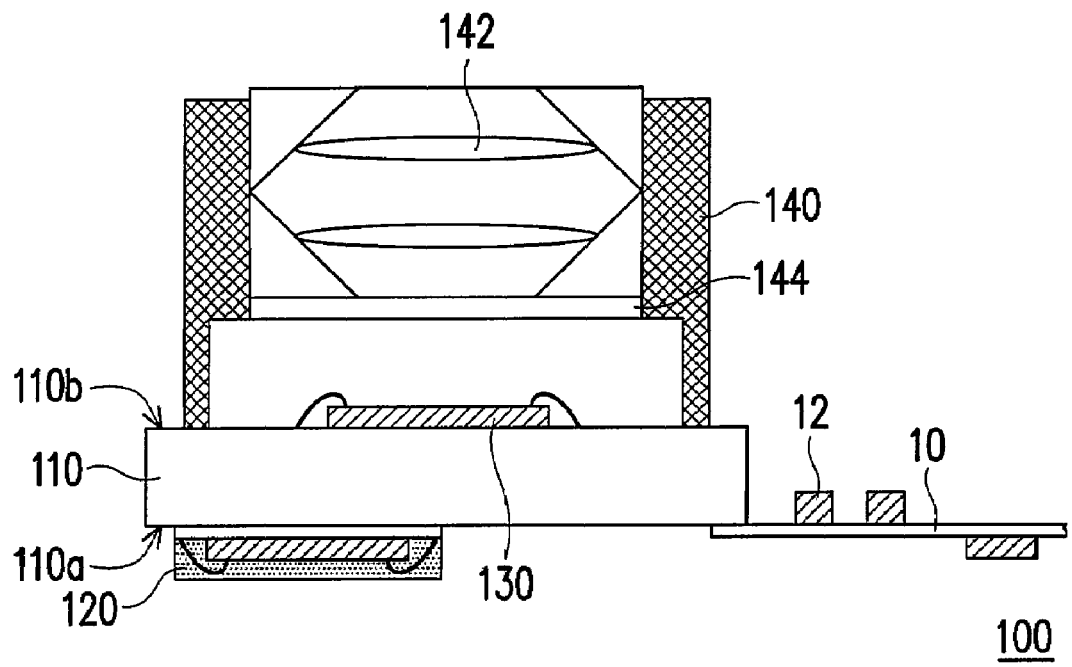
FIG. 1 is a schematic view of a conventional image sensor module.
Figure 2:
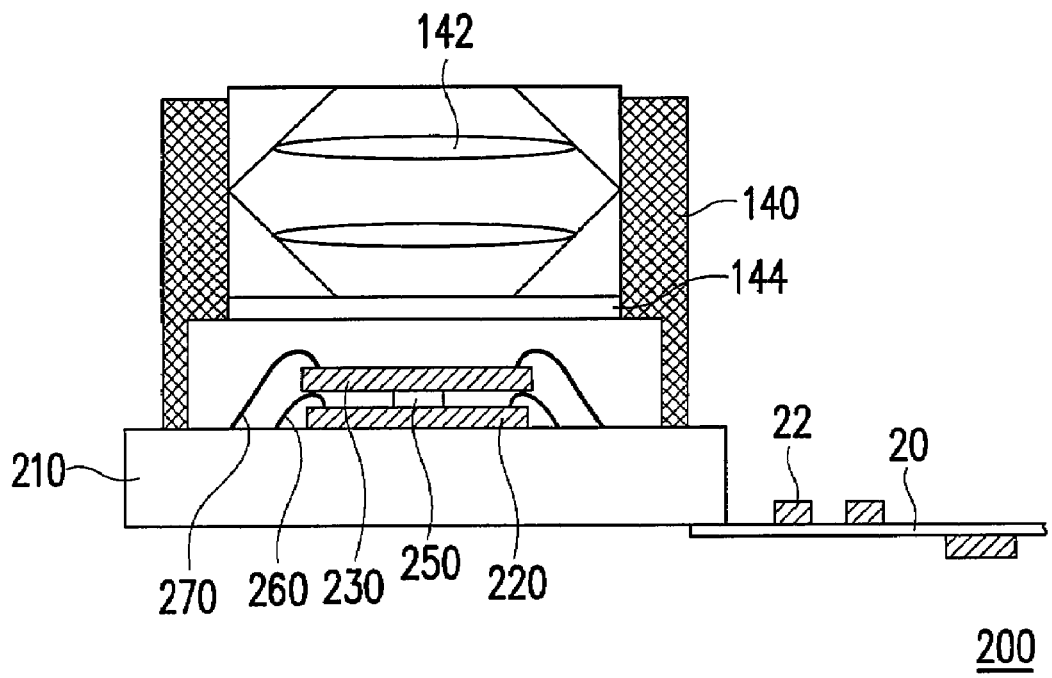
FIG. 2 is a schematic view of another conventional image sensor module.
Figure 3:
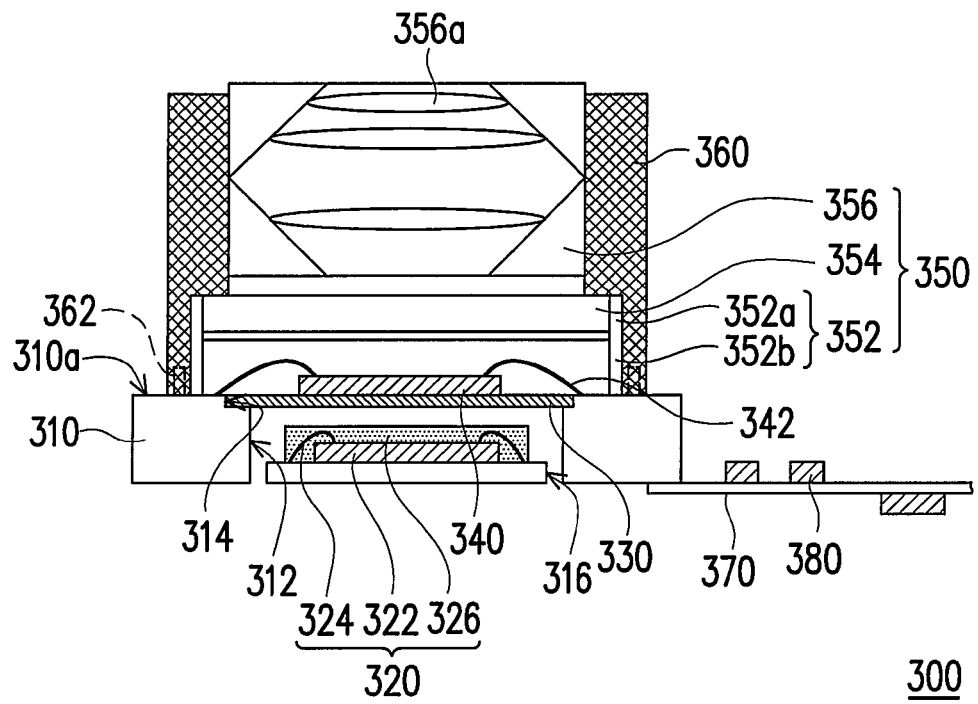
FIG. 3 is a schematic view of an image sensor module according to a preferred embodiment of the present invention.

FIG. 3 is a schematic view of an image sensor module according to a preferred embodiment of the present invention. Referring to FIG. 3, the image sensor module 300 comprises a substrate 310, an image signal processor 320, a supporting board 330, an image sensor chip 340 and a cover 350. A concavity or concave 312 is located on a surface 310a of the substrate 310. The image signal processor 320 is disposed in the concave 312 of the substrate 310, and is electrically connected to the substrate 310, wherein the depth of the concave 312 is greater than the thickness of the image signal processor 320. In an embodiment of the present invention, the image signal processor 320 comprises an image signal processing chip 322, a plurality of wire-bonding wires 324 and a molding compound 326. The image signal processing chip 322 is electrically connected to the substrate 310 via the wire-bonding wires 324. The molding compound 326 covers the image signal processing chip 322 and the wire-bonding wires 324 to prevent the same from damage and moisture. However, except being electrically connected to the substrate 310 by wire bonding, the image signal processing chip 322 may also be electrically connected to the substrate 310 by flip-chip technique or other manners. There is no limit on the electrically connecting manners between the image signal processing chip 322 and the substrate 310 in the present invention. It should be mentioned that the height of the image sensor module 300 is not additionally increased by the image signal processor 320 due to the image signal processor 320 being disposed in the concave 312 of the substrate 310.

The supporting board 330 is disposed on the top surface 310a of the substrate 310, and covers the concave 312. The image sensor chip 340 is disposed on the supporting board 330 to capture images, and is electrically connected to the substrate 310 via the wire-bonding wires 342. It is known from the above that, the image signal processor 320 is disposed in the concave 312 of the substrate 310, and the supporting board 330 covers the concave 312, thus, the image signal processor 320 disposed in the concave 312 is not easily damaged by external force, and thereby the image signal processor 320 can be operated normally. Furthermore, a positioning slot or concave 314 can be disposed on the top edge of the concave 312 of the substrate 310 to support the supporting board 330, and thereby achieving the positioning effect. In order to achieve a preferred heat dissipation effect, the supporting board 330 may be a heat sink, so as to transfer the heat generated by the image sensor chip 340 towards the exterior of the chip 340, thus, the image sensor chip 340 can be operated under a proper working temperature, so as to prolong its life time.

Figure 4:
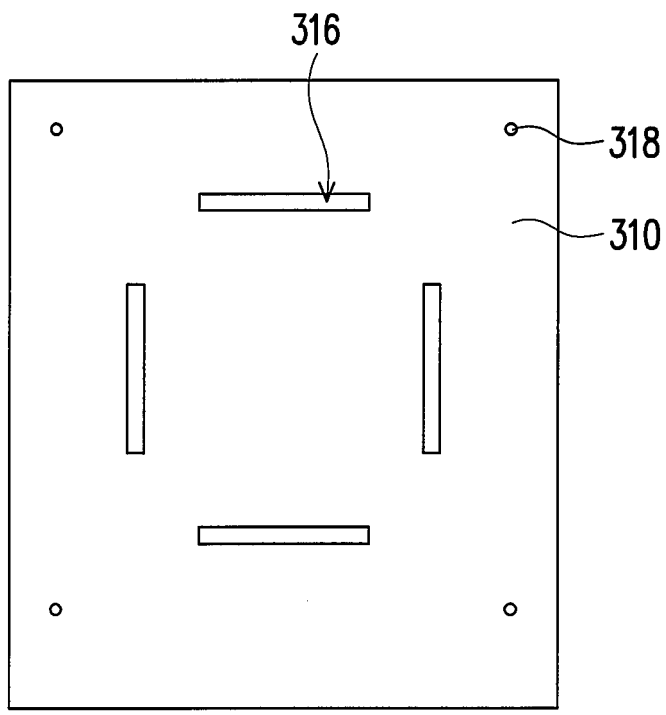
FIG. 4 is a top view of the substrate in FIG. 3.

Referring to both FIG. 3 and FIG. 4, FIG. 4 is a top view of the substrate in FIG. 3. In this embodiment, relatively high working temperature of the interior of the image sensor module 300 during operation may result in a lower working efficiency or a shorter life time of the image sensor module 300. Thus, at least one vent hole 316 (4 vent holes shown in FIG. 4) can be further formed on the bottom of the concave 312 of the substrate 310, wherein the vent holes 316, for example, penetrate through the substrate 310 and are disposed around the image signal processor 320. Thus, the convection effect between the vent holes 316 and the ambient environment is utilized in this embodiment to lower the interior temperature of the image sensor module 300, so that the image sensor module 300 can operate steadily and normally.

The cover 350 of this embodiment is disposed on the substrate 310, and covers the image sensor chip 340. The cover 350 mainly comprises an adapter 352, a glass cover board 354 and an actuator 356. The adapter 352 is disposed on the substrate 310, and has an upper section 352a and a lower section 352b. The upper section 352a has an accommodating space, and the lower section 352b covers the image sensor chip 340. The glass cover board 354 is disposed within the accommodating space of the upper section 352a of the adapter 352. The actuator 356 is disposed on the glass cover board 354, wherein the glass cover board 354 may be a filter for filtering out unnecessary lights. In addition, in order to focus the lights entering the image sensor module 300 on the image sensor chip 340, the actuator 356 has at least one optical lens 356a (3 optical lenses 356a showed in FIG. 3), so that the light entering the image sensor module 300 is successfully focused on the image sensor chip 340 after passing through the optical lenses 356a. Further, the image sensor module 300 of this embodiment may control the movement of the actuator 356 by the image signal processor 320, so as to accomplish the self-focusing.

The elements within the image sensor module 300 are precise optical elements. In order to protect the elements within the image sensor module 300 from being damaged by external forces, the image sensor module 300 of this embodiment may further comprise a housing 360 disposed on the substrate 310, and the adapter 352, the glass cover board 354 and the actuator 356 are accommodated within and protected by the housing 360. The housing 360 may be positioned by, for example, at least one positioning hole 362 and the corresponding positioning pin 318 on the substrate 310. Thus, the housing 360 is fixed on the substrate 310 precisely and firmly.

In a preferred embodiment, the substrate 310 is suitable for being electrically connected to a flexible circuit substrate 370, so as to transfer image signals captured by the image sensor module 300 to the chip 380 on the flexible circuit substrate 370, thereby processing the image signals.

In summary, the image sensor module of the present invention has a concave disposed on the substrate, and the image signal processor is disposed in the concave of the substrate, so as to reduce the whole thickness of the image sensor module. The heat sink and the vent hole on the bottom of the concave are utilized to keep the interior temperature of the image sensor module at a normal working temperature, so as to enhance the heat dissipation effect. Compared with the conventional art, the image sensor module of the present invention has the following advantages.

1. Since the image signal processor is disposed in the concave of the substrate, the image signal processor does not additionally increase the height of the image sensor module. Therefore, the image sensor module of the present invention has a smaller module thickness to satisfy the current requirement for electronic products of being light, slim, short, small and portable.

2. Since the image sensor chip is disposed on the heat sink, the internal heat of the image sensor chip under working condition is delivered to the exterior of the chip by the heat sink, so that the overheat problem does not easily occur to the image sensor chip and cause failure or damage. Thus, the life time of the image sensor module is prolonged.

3. Since the present invention disposes vent holes on the bottom of the concave of the substrate, the heats generated during the operation of the image sensor chip, the image signal processor or other elements in the image sensor module are dispersed via the heat convection effect between the vent holes and the ambient environment. Therefore, the image sensor module has a preferred working efficiency.

4. Since the image signal processor is disposed in the concave of the substrate, and the image sensor chip is covered by the cover, the image signal processor and the image sensor chip are well protected in structure, that is, the image signal processor and the image sensor chip are not easily damaged to cause failure of the image sensor module.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An image sensor module, comprising:
    a substrate, having a concavity therein and at least a vent hole formed in a bottom portion of the concavity penetrating through the substrate;
    an image signal processor, disposed in the concavity of the substrate and electrically connected to the substrate;
    a supporting board, disposed on a top surface of the substrate and covering the concavity, wherein the image signal processor is physically and electrically unconnected to the supporting board;
    an image sensor chip, disposed on the supporting board and electrically connected to the substrate; and
    a cover, disposed on the substrate and covering the image sensor chip.

2. The image sensor module as claimed in claim 1, wherein the cover comprises:
    an adapter, disposed on the substrate, and having an upper section and a lower section, wherein the upper section has an accommodating space, and the lower section covers the image sensor chip;
    a glass cover board, disposed within the accommodating space of the adapter; and
    an actuator, disposed on the glass cover board, and having at least one optical lens, wherein the movement of the actuator is controlled by the image signal processor, so as to accomplish self-focusing.

3. The image sensor module as claimed in claim 2, wherein the glass cover board is a filter.

4. The image sensor module as claimed in claim 2, further comprising a housing, wherein the housing is disposed on the substrate; the adapter, the glass cover board and the actuator are accommodated within the housing.

5. The image sensor module as claimed in claim 4, wherein the substrate further comprises at least one positioning pin, the housing has at least one positioning hole corresponding to the positioning pin, and the positioning pin is inserted into the positioning hole, so as to position the housing and the substrate.

6. The image sensor module as claimed in claim 1, wherein a depth of the concavity is larger than a thickness of the image signal processor.

7. The image sensor module as claimed in claim 1, wherein the substrate is suitable for being electrically connected to a flexible circuit substrate.

8. The image sensor module as claimed in claim 1, wherein the image signal processor comprises an image signal processing chip, a plurality of wire-bonding wires and a molding compound, wherein the image signal processing chip is electrically connected to the substrate via the wire-bonding wires, and the molding compound covers the image signal processing chip and the wire-bonding wires.

9. The image sensor module as claimed in claim 1, wherein the substrate further has a positioning slot located on a top edge of the concavity, for supporting the supporting board.

10. The image sensor module as claimed in claim 1, wherein the supporting board is a heat sink.

11. The image sensor module as claimed in claim 1, further comprising a plurality of wire-bonding wires, wherein the image sensor chip is electrically connected to the substrate via the wire-bonding wires.

* * * * *